(12) United States Patent
Mignot et al.

(10) Patent No.: US 10,658,180 B1
(45) Date of Patent: May 19, 2020

(54) EUV PATTERN TRANSFER WITH ION IMPLANTATION AND REDUCED IMPACT OF RESIST RESIDUE

(71) Applicant: INTERNATIONAL BUSINESS MACHINES CORPORATION, Armonk, NY (US)

(72) Inventors: Yann Mignot, Slingerlands, NY (US); Yongan Xu, Niskayuna, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/177,881

(22) Filed: Nov. 1, 2018

(51) Int. Cl.
*H01L 21/033* (2006.01)
*H01L 21/3115* (2006.01)
*G03F 7/20* (2006.01)
*H01L 21/311* (2006.01)
*H01L 21/308* (2006.01)

(52) U.S. Cl.
CPC ........ *H01L 21/0337* (2013.01); *G03F 7/2022* (2013.01); *H01L 21/3088* (2013.01); *H01L 21/31111* (2013.01); *H01L 21/31155* (2013.01)

(58) Field of Classification Search
None
See application file for complete search history.

(56) References Cited

U.S. PATENT DOCUMENTS

| 4,807,016 | A |  | 2/1989 | Douglas |  |
|---|---|---|---|---|---|
| 5,300,403 | A |  | 4/1994 | Angelopolus et al. |  |
| 6,080,663 | A | * | 6/2000 | Chen | H01L 21/76825 438/637 |
| 6,657,268 | B2 |  | 12/2003 | Besser et al. |  |
| 6,753,129 | B2 |  | 6/2004 | Livesay et al. |  |
| 7,175,944 | B2 | * | 2/2007 | Yin | G03F 7/11 430/14 |
| 8,222,154 | B2 | * | 7/2012 | Doris | H01L 21/0337 216/41 |

(Continued)

FOREIGN PATENT DOCUMENTS

WO 2007082745 A1 7/2007

OTHER PUBLICATIONS

Charavel et al., "Tuning of Etching Rate by Implantation: Silicon, Polysilicon and Oxide", AIP Conference Proceedings. Nov. 13, 2006. vol. 866. No. 1. pp. 325-328.

(Continued)

*Primary Examiner* — Andres Munoz
(74) *Attorney, Agent, or Firm* — Tutunjian & Bitetto, P.C.; Vazken Alexanian

(57) ABSTRACT

A method is presented for amplifying extreme ultraviolet (EUV) lithography pattern transfer into a hardmask and preventing hard mask micro bridging effects due to resist residue in a semiconductor structure. The method includes forming a top hardmask over an organic planarization layer (OPL), depositing a photoresist over the top hardmask, patterning the photoresist using EUV lithography, performing ion implantation to create doped regions within the exposed top hardmask and regions of hardmask underneath resist residue, stripping the photoresist, and selectively etching the top hardmask by either employing positive tone or negative tone etch based on an implantation material.

18 Claims, 4 Drawing Sheets

(56) References Cited

U.S. PATENT DOCUMENTS

| | | | |
|---|---|---|---|
| 9,941,125 B2* | 4/2018 | Yang | H01L 21/2658 |
| 10,494,715 B2* | 12/2019 | Agarwal | H01L 21/0332 |
| 2002/0068432 A1* | 6/2002 | Jeng | H01L 21/3105 |
| | | | 438/623 |
| 2003/0224611 A1* | 12/2003 | Seta | H01L 21/31116 |
| | | | 438/706 |
| 2005/0106861 A1* | 5/2005 | Fehlhaber | B81C 1/00396 |
| | | | 438/659 |
| 2009/0233448 A1* | 9/2009 | Cho | H01L 21/0337 |
| | | | 438/705 |
| 2011/0020753 A1* | 1/2011 | Clevenger | H01L 21/3086 |
| | | | 430/313 |
| 2013/0022930 A1* | 1/2013 | Clevenger | H01L 21/3086 |
| | | | 430/326 |
| 2013/0026133 A1* | 1/2013 | Engelmann | H01L 21/0332 |
| | | | 216/47 |
| 2014/0187027 A1* | 7/2014 | Xu | H01L 21/266 |
| | | | 438/530 |
| 2018/0233368 A1* | 8/2018 | Yang | H01L 21/2658 |
| 2019/0348281 A1* | 11/2019 | Xu | H01L 21/31144 |

OTHER PUBLICATIONS

Choquette et al., "Dry lithography using focused ion beam inplantation and reactive ion etching of SiO2", Applied Physics Letter. vol. 62. No. 25. Jun. 21, 1993. pp. 3294-3296.

Lamarche et al., "Focused ion beam microlithography using an etch-stop process in gallium-doped silicon", Journal of Vacuum Science & Technology B: Microelectronics Processing and Phenomena. vol. 1. No. 4. Oct.-Dec. 1983. pp. 1056-1058.

Qian et al., "Fabrication of Si microstructures using focused ion beam implantation and reactive ion etching", Journal of Micromechanics and Microengineering. vol. 18. No. 3: 035003. Jan. 17, 2008. pp. 1-5.

* cited by examiner

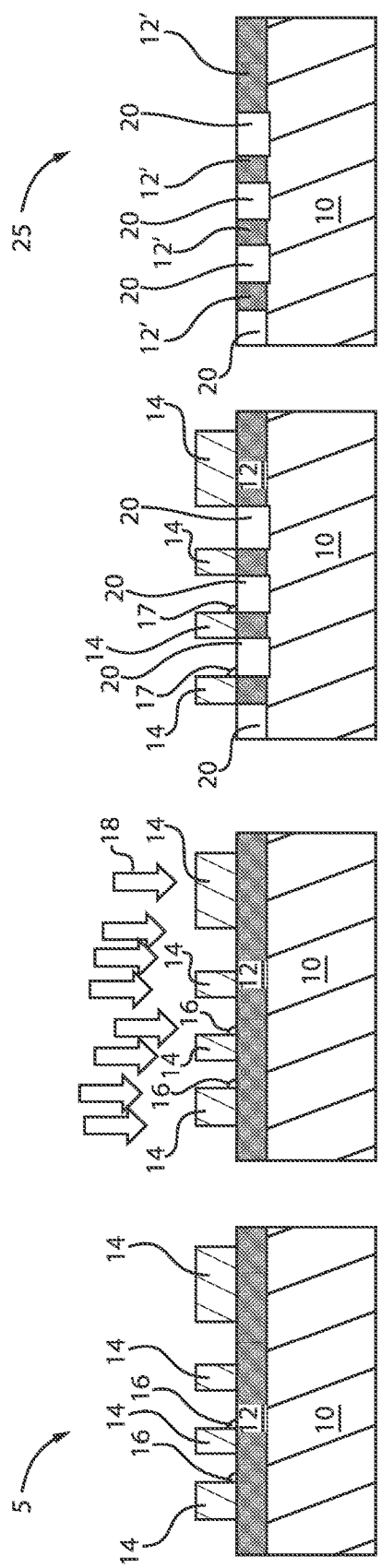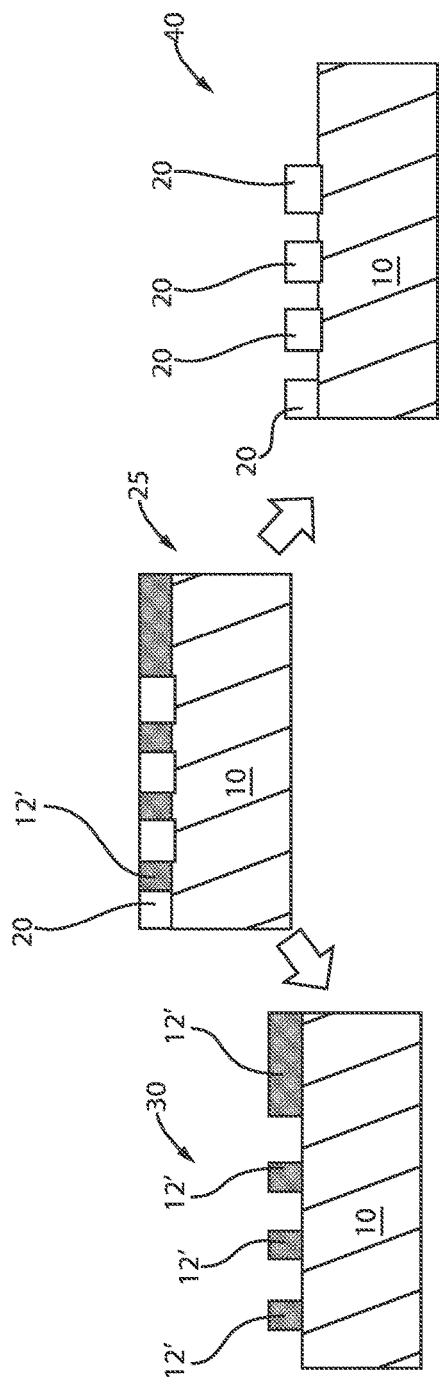

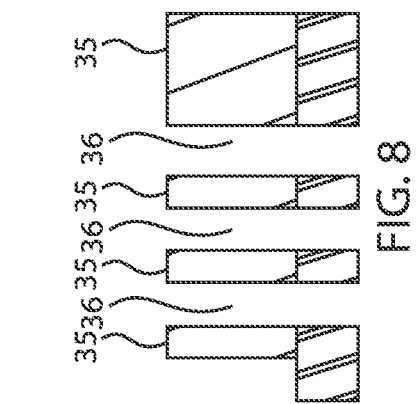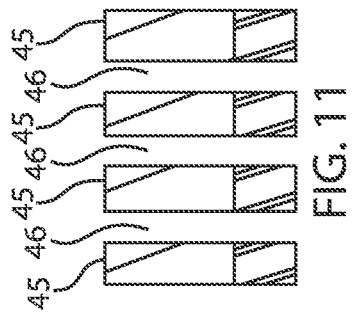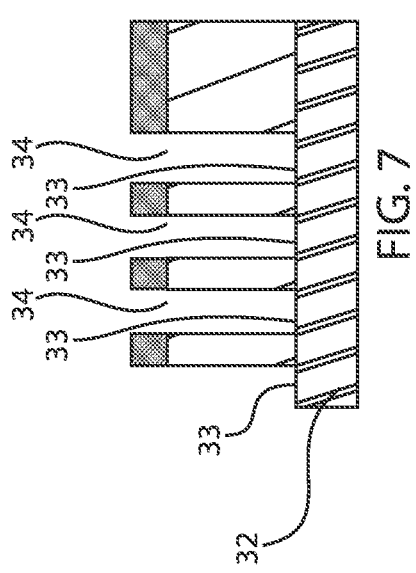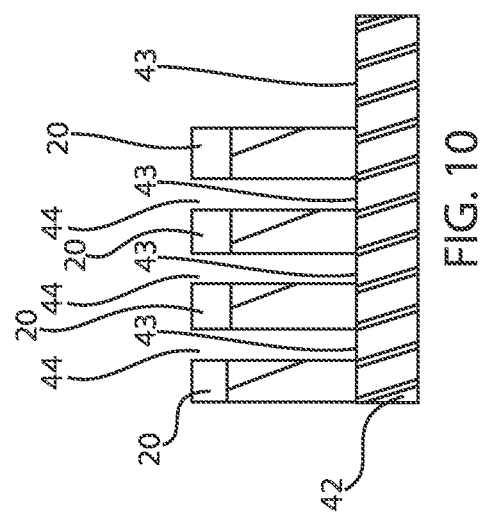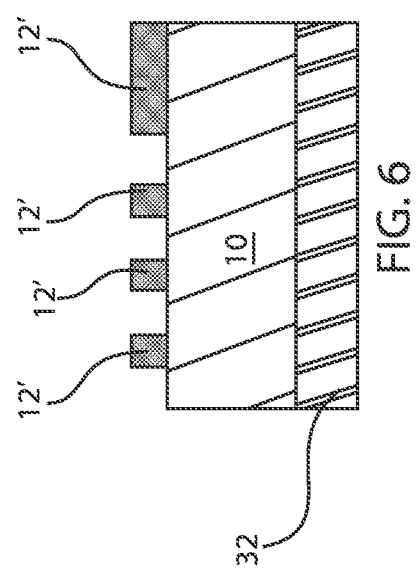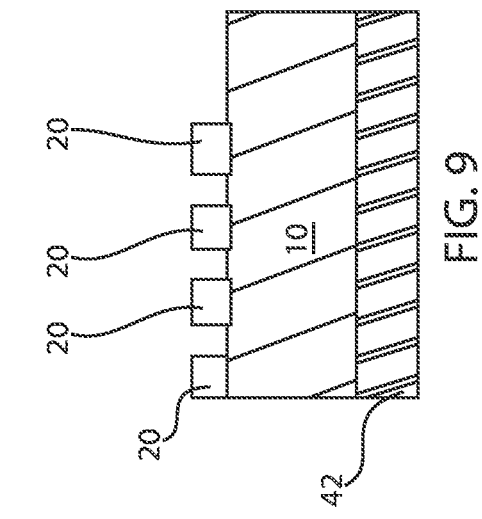

EUV PATTERN TRANSFER WITH ION IMPLANTATION AND REDUCED IMPACT OF RESIST RESIDUE

BACKGROUND

Technical Field

The present invention relates generally to semiconductor devices, and more specifically, to implantation post extreme ultraviolet (EUV) lithography to prevent defectivity transfer caused by resist scumming and resist line breaks.

Description of the Related Art

During the semiconductor patterning process it is common for micro-bridging defects to occur. It is particularly common for micro-bridging defects to form in the resist patterns after the EUV lithography process in advanced technology nodes, for example, nodes of approximately 7 nm and beyond. This is due to different physical mechanisms of EUV radiation exposure and its interaction with resist constituents as opposed to processes occurring during more common ultraviolet exposure in optical lithography. Micro-bridging defects include small connections between two adjacent lines in a photo-resist pattern, which can cross-link two or more resist patterns in close proximity leading to the creation of single-line openings or adjacent-line electrical shorts after etching. Various micro-bridging defects are collectively referred to as resist scumming. These micro-bridging defects are often caused by incomplete resist modification during EUV exposure processes. A higher EUV radiation exposure dose can reduce micro-bridging but also results in an increased line edge roughness and undesirable resist line erosion. In addition, a higher EUV radiation exposure dose carries a tool throughput penalty greatly affecting economic viability of EUV lithography processes. The resist patterns of micro-bridging defects and/or increased line edge roughness and resist line erosion can cause a decrease in the production yield of advanced integrated circuits.

This invention is directed to reducing or eliminating any negative impact of resist scumming onto the production yield of advanced integrated circuits and to improving economics of EUV-based lithography and related pattern definition processes.

SUMMARY

In accordance with an embodiment, a method is provided for amplifying extreme ultraviolet (EUV) lithography pattern transfer into a hardmask and preventing hard mask micro bridging effects due to resist scumming in a semiconductor structure. The method includes forming a top hardmask over an organic planarization layer (OPL), depositing a photoresist over the top hardmask, patterning the photoresist using EUV lithography, performing ion implantation to create doped regions within the exposed top hardmask and regions of hardmask underneath resist scumming, stripping the photoresist, and selectively etching the top hardmask by either employing positive tone or negative tone etch based on an implantation material.

In accordance with another embodiment, a method is provided for amplifying extreme ultraviolet (EUV) lithography pattern transfer into a hardmask and preventing hard mask micro bridging effects due to resist scumming in a semiconductor structure. The method includes implanting an implantation material into a top hardmask and through a photoresist, creating a plurality of modified regions within the exposed top hardmask and regions of hardmask underneath resist scumming, stripping the photoresist, and selectively etching the top hardmask by either employing positive tone or negative tone based on the implantation material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a cross-sectional view of a semiconductor structure including an EUV-compatible photoresist formed over a hardmask, in accordance with an embodiment of the present invention;

FIG. 2 is a cross-sectional view of the semiconductor structure of FIG. 1 where implantation takes place after EUV lithography, in accordance with an embodiment of the present invention;

FIG. 3 is a cross-sectional view of the semiconductor device of FIG. 2 where the implanted element penetrates into the hardmask, in accordance with an embodiment of the present invention;

FIG. 4 is a cross-sectional view of the semiconductor device of FIG. 3 where the photoresist is removed, in accordance with an embodiment of the present invention;

FIG. 5 is a cross-sectional view of the semiconductor device of FIG. 4 where either a positive tone etch or a negative tone etch is applied, in accordance with an embodiment of the present invention;

FIG. 6 is a cross-sectional view of FIG. 5 where "positive tone etch" process is employed, in accordance with an embodiment of the present invention;

FIG. 7 is a cross-sectional view of FIG. 6 where the organic planarization layer (OPL) is etched, in accordance with an embodiment of the present invention;

FIG. 8 is a cross-sectional view of FIG. 7 where the top hardmask is removed and the bottom hardmask is etched, in accordance with an embodiment of the present invention;

FIG. 9 is a cross-sectional view of FIG. 5 where "negative tone etch" process is employed, in accordance with an embodiment of the present invention;

FIG. 10 is a cross-sectional view of FIG. 9 where the organic planarization layer (OPL) is etched utilizing negative tone etch process, in accordance with an embodiment of the present invention;

FIG. 11 is a cross-sectional view of FIG. 10 where the doped regions are removed and the bottom hardmask is etched, in accordance with an embodiment of the present invention;

Throughout the drawings, same or similar reference numerals represent the same or similar elements.

DETAILED DESCRIPTION

Figure 12:
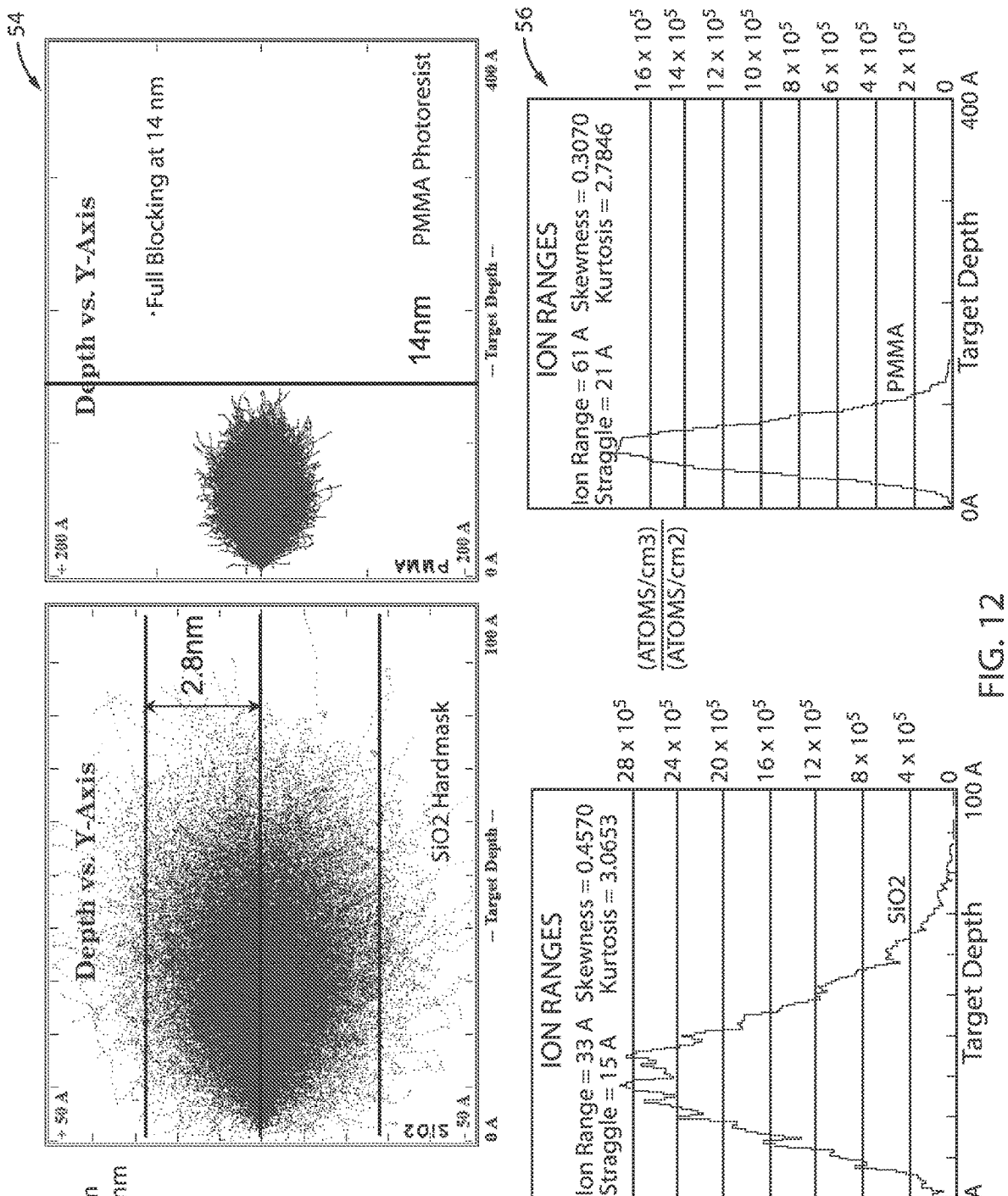
FIG. 12 illustrates graphs where silicon (Si) is implanted (1 keV) into a silicon oxide ($SiO_2$) hardmask and where a polymethyl methacrylate (PMMA) photoresist is employed, in accordance with an embodiment of the present invention.

Embodiments in accordance with the present invention provide methods and devices for preventing or minimizing resist scumming and broken resist lines in semiconductor manufacturing. During the semiconductor patterning process it is common for micro-bridging defects to occur. It is particularly common for micro-bridging defects to form in the resist patterns after the EUV lithography process in advanced technology nodes, for example, nodes of approximately 7 nm and beyond. These micro-bridging or resist scumming defects are often caused by incomplete resist modification during EUV exposure processes. Micro-bridging defects include small connections between two adjacent lines in a photoresist pattern, which can connect two or more resist patterns in close proximity leading to the creation of open or short defects after etching. The open or short defects can cause a decrease in the production yield of advanced integrated circuits.

EUV lithography is a lithography technique where extreme ultraviolet radiation is employed to transfer a pattern from a mask pattern into a resist pattern. The wavelength of the EUV light source is usually about 13.5 nm. The mask tone can be either dark field or bright field. In the dark field mask, the majority, >60%, of the mask area is covered by absorber material and is not reflective, while in the bright field mask, the majority of the mask is a multi-mirror area, and only 15% to 40% of the mask area is covered by the absorber material. The EUV resist can be either conventional organic chemical amplification resist (CAR) or non-conventional metal contained inorganic resist. The organic CAR resist usually has relatively low absorption at 13.5 nm wavelength with k value range from about 0.001 to about 0.01. The metal contained inorganic resist has a relatively high absorption coefficient, which is determined by the chemically or physically mixed metal material. In the positive tone develop process, usually a dark field mask is used, and in the negative tone develop process, usually a bright field mask is used.

The EUV lithography stack can be either a tri-layer stack or a quad layer stack. In the quad layer stack, the EUV resist is coated on top of an organic adhesion layer to prevent resist pattern collapse. Underneath the organic adhesion layer, there are a thin hard mask layer (usually about 3-10 nm) and an organic planarization layer (OPL), in which the hard mask can be low temperature oxide (LTO), amorphous silicon, or other metal oxide materials. In the tri-layer lithography stack, the EUV resist is coated on top of the hard mask layer, such as silicon anti-reflective coating (SiARC) or LTO, with the OPL layer at the bottom. There are many factors that contribute to the EUV stochastic effect, including photon physical property, scanner dose noise, illumination set up, mask defectivity, resist performance, develop process, and the second electron effect from the under layer. The EUV resist thickness is usually thin, and varies from about 20 nm to about 40 nm in order to avoid the resist pattern collapse at a high aspect ratio. There are two major defectivity types on wafer post lithography, one is called resist residual or scumming inside the trench or hole pattern, the other is called dented resist line with thinner resist height or thickness than that expected. These two types of lithography defectivity are caused by the EUV stochastic effect mentioned above. This resist scumming behavior causes the line bridging, and the dented resist line causes the line breaks in the silicon product after final etch, hence affecting the yield. A small lithography dose-to-size helps reduce the line breaks, but does not help the resist scumming. A high lithography dose-to-size potentially helps the resist scumming, but does not reduce the line breaks. In such case, a new lithography film stack and integration flow is needed to mitigate defectivity to transfer to silicon during the etch process.

The exemplary embodiments of the present invention employ a solution for EUV resist scumming and pattern transfer with positive and negative tone developer. Broken resist lines, excessive resist line edge roughness (LER), and bridging patterns resulting from scumming in trenches can be minimized or significantly reduced by incorporating an implantation step after the EUV lithography step but before the hardmask etching step and conducting EUV exposure at a reduced radiation dose. Reduced or moderate EUV exposure doses result in reduced LER and resist line erosion while degrading micro-bridging or resist scumming. The implantation step and post resist develop step assist in transferring the resist pattern into the underlying hard mask with a minimal impact from the resist micro bridging defects. In other words, the implantation step is performed between the lithography step, including resist pattern definition, and the hardmask etching step. The implantation results in a modified top hardmask surface in the open areas where the hard mask surface is not covered by the resist as well as under the micro-bridging defects, which aids in alleviating detrimental effects of micro-bridging onto resultant etched structure. The areas of hard mask that are protected by resist lines remain unmodified. The implanted material is selectively implanted into the top hardmask material in such a way that the implanted material penetrates through the resist micro-bridging defects but does not penetrate through the resist lines. Stated differently, the implanted material penetrates the top hardmask under micro-bridging defects and in exposed areas only and creates doped regions within the top hardmask. The implantation thus modifies the composition of the top hardmask in pre-selected regions irrespective of the presence or absence of micro-bridging defects so that the etch rate is different for modified regions versus non-modified regions of the top hardmask.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

FIG. 1 is a cross-sectional view of a semiconductor structure including an EUV-compatible photoresist formed over a hardmask, in accordance with an embodiment of the present invention.

A semiconductor structure 5 includes a hardmask 12 formed over an organic planarization layer (OPL) 10. A photoresist 14 is applied over the hardmask 12. Scumming residue 16 can be present in trenches formed between the photoresist 14. The photoresist thickness post development on the wafer, can vary from about 12 nm to about 20 nm. Resist micro-bridging or scumming 16 residual thickness can be about equal or less than one third of resist thickness or, equivalently, can range from about 0 nm to about 6 nm.

The OPL layer 10 and the hardmask 12 can be employed as a lithographic stack to pattern the underlying layers. The OPL layer 10 is formed at a predetermined thickness to provide topography control during resist exposure and during etching of the layers below. The OPL layer 10 can include an organic material, such as a polymer. The thickness of the OPL 10 can be in a range from about 50 nm to about 300 nm. In one example, the thickness of the OPL 10 is about 100 nm.

In another example, the hardmask layer 12 can be a dielectric layer such as silicon oxide. The HM material is deposited using a low temperature deposition process to be compatible with the underlying polymer-based OPL layer 10. In one example, such low-temperature deposition process atomic layer deposition (ALD) conducted at a temperature ranging from about room temperature (23° C.) to about 400° C. depending on OPL layer thermal stability. The thickness of the HM layer 12 can be in range from about 3 nm to about 100 nm. Exemplary materials for a hard mask layer include, but are not limited to, silicon, silicon oxide, silicon nitride, silicon oxynitride, and metal oxides such as tantalum oxide (TaO) and titanium oxide (TiO), for instance. Alternatively, the hard mask layer 12 can be formed, depending on materials, for example, using other low-temperature deposition processes such as sputter deposition, chemical vapor deposition, or spin coating.

The hard mask layer 12 is formed to serve as a rigid media for pattern transfer from the resist and to act as a buffer layer for subsequent processes. The hard mask layer 12 can be formed with a material having an etching selectivity with respect to the OPL 10 and with respect to the photoresist layer 14.

A EUV lithography process usually includes applying a layer of EUV-compatible photoresist material 14 (e.g., a material that will react when exposed to extreme ultraviolet radiation and its secondary effects such as secondary electrons), and then selectively exposing portions of the photoresist 14 to EUV radiation or other ionizing radiation (e.g., electron beams, X-rays, etc.), thereby changing the solubility of exposed portions of the material. The photoresist 14 is then developed by washing the resist with a developer solution, such as, e.g., tetramethylammonium hydroxide (TMAH), thereby removing non-irradiated (in a negative resist) or irradiated (in a positive resist) portions of the resist layer.

In the positive tone develop process, the well exposed or over-exposed resist will be completely developed and removed. However, the resist with under-exposure or not having enough acid generation will end up with the incomplete development, which causes the resist scumming inside the trench or hole structure. On the other hand, in the over-exposed area, the resist line height potentially gets reduced due to the excessive photons scattered from the bright region of the mask.

FIG. 2 is a cross-sectional view of the semiconductor structure of FIG. 1 where implantation takes place after EUV lithography, in other words after performing selective resist exposure to EUV radiation and steps of developing resist layer in desired patterns, in accordance with an embodiment of the present invention.

Advantageously, the EUV radiation dose is chosen to be light to moderate or from about 15 mJ/cm$^2$ to about 90 mJ/cm$^2$ such that the developed resist lines have a reduced line edge roughness and a reduced resist line erosion. Furthermore, selecting such low to moderate EUV radiation exposure dose results in improved manufacturing throughput of EUV exposure tools. The manufacturing throughput of EUV exposure tools is often reversely proportional to the selected EUV radiation exposure dose. However, selecting such low to moderate EUV radiation exposure dose can also result in increased intensity of micro-bridging defects or resist scumming. The thickness of micro-bridging defects can be about equal or less than one third of resist thickness or, equivalently, can range from about 0 nm to about 6 nm, as noted above.

In various example embodiments, ion implantation 18 takes place after EUV resist exposure and patterning. Ion implantation is a low-temperature process by which ions of one element are accelerated into a solid target, thereby changing the physical, chemical, or electrical properties of the target. This ion implantation process can be conducted in a conventional beam line implanter or in plasma implantation or doping equipment. In a conventional beam line implanter, the ions are extracted from a plasma source, filtered by their charge-to-mass ratio, and shaped to form a nearly monenergistic and nearly monoisotopic ion beam within a high vacuum environment. The ion beam can be accelerated or decelerated to obtain the targeted ion implantation energy and can be filtered again immediately prior to impinging onto the wafer surface. The ion beam scans the wafers surface in such a way that each point on the wafer surface gets a certain dose of implanted ions. The wafer can be tilted and rotated with respect to the ion beam axis resulting in an implantation with desired tilt and twist angles, however, a zero degree tilt (or implantation perpendicular to the wafer surface) is highly desirable for the present application.

A particular value of twist angle (wafer notch orientation) loses importance for implantation conducted perpendicular to the wafer surface. A plasma implanter or plasma doping equipment immerses a wafer into a gaseous plasma. The gaseous plasma includes ions of elements targeted for implantation as well as ionized molecules including such elements. These ions and ionized molecules are accelerated toward the substrate by using the substrate electrical bias with respect to the plasma electrical potential. The wafer bias controls the ion implantation energy in this case. The ion implantation dose is controlled by the substrate bias duration or, equivalently, by the number of bias pulses of a fixed duration per pulse. A highly desirable regime of near mono-energetic implantation perpendicular to the wafer surface is achieved by conducting plasma implantation at a low ambient pressure of less than about 10 mTorr. Plasma implantation has a cost advantage over a conventional beam line implantation at high implanted doses, especially, in the excess of $10^{15}$ ions/cm$^2$.

The ions can alter the elemental composition of the target when they stop and remain in the target. In the instant target s the hardmask 12. The resist material 14 and resist residual 16 inside the trench will be implanted as well. The resist residual 16 is penetrated through by implanted ions doping the hardmask 12 directly underneath, while the resist lines 14 block implanted ions leaving the hardmask 12 underneath undoped. This can be accomplished by selecting the implantation e y such that the majority of ions penetrate through the resist residual 16 but most of them are captured by or stopped in the resist material 14. Effectively, such ion implantation process is employed to amplify the pattern transfer in EUV lithography. This, in turn, can ease the requirement on the EUV radiation exposure dose leading to less resist line erosion and edge roughness, less resist line breaks, and a higher manufacturing throughput of EUV exposure tools. It will be appreciated that such pattern transfer amplification process has an additional economic benefit of reducing a total cost of EUV patterning. The relative cost of such ion implantation process is ten to thirty times lower than that of EUV exposure process depending on the choice of ion implantation equipment and the implanted ion dose. In one example, reducing the required EUV radiation exposure dose by at least 10% by employing such ion implantation process carries an overall reduction in EUV patterning cost.

In one example, silicon (Si) ions are implanted into the hardmask 12. Silicon ions are representative of a class of ions that retard etching of implanted hardmask 12. Other members of this class include carbon, nitrogen, boron, and metallic elements such aluminum, gallium, indium, tin, and rare earth metals (e.g., lanthanum, yttrium). The hardmask thickness is selected to be comparable to that of the patterned resist line 14. The silicon ion implantation energy is selected to be high enough for ions to penetrate through the resist residual 16 (resist scumming) into the top portion of hardmask 12 but low enough for ions to be stopped in the patterned resist lines 14.

In some embodiments, the EUV photoresist material is, e.g., polymethyl methacrylate (PMMA), the resist line 14 height or thickness is about 15 nm, the thickness of resist residual 16 (resist scumming) is about 5 nm or less, the thickness of hardmask 12 is about 10 nm, and the selected silicon ion implantation energy is about 1000 eV. The silicon ion dose is selected to substantially modify the chemical properties of hard mask 12. This can be accomplished when the volume concentration of implanted silicon atoms is from about 0.2 atomic percent to about 20 atomic percent or, equivalently, from about $10^{20}$ atoms/cm$^3$ to about $10^{22}$ atoms/cm$^3$. This volume concentration of silicon atoms in implanted hardmask 12 including regions under resist residual 16 (resist scumming) can be achieved with the implanted silicon ion dose of from about $10^{14}$ ions/cm$^2$ to about $10^{16}$ ions/cm$^2$.

Without providing any limitation, the resist residual 16 (resist scumming) is blocking less than half of the implanted ion dose in this example. While the type of photoresist material, the thickness of resist line 14 and the related thickness of resist residual 16, the thickness of hardmask 12, and the atomic number (Z) of selected etch retarding element can vary, thus affecting the choice of the ion implantation energy and dose, the range of ion implantation energy of from about 500 eV to about 5 keV and ion implantation dose of from about $10^{14}$ ions/cm$^2$ to about $10^{16}$ ions/cm$^2$ can be employed to selectively dope the exposed hardmask 12, including regions under resist residual 16 (resist scumming), to the level of from about $10^{20}$ atoms/cm$^3$ to about $10^{22}$ atoms/cm$^3$ or, equivalently, from about 0.2 atomic percent to about 20 atomic percent.

In other examples, argon (Ar) ions are implanted into the hardmask 12. Argon ions are representative of a class of ions that speed up etching of implanted hardmask 12. Other members of this class include phosphorus, arsenic, boron, and alternative noble elements such as neon, krypton, and xeon. The argon ion implantation energy is selected to be high enough for ions to penetrate through the resist residual 16 (resist scumming) into the hardmask 12 but low enough for ions to be stopped in the patterned resist lines 14.

In some embodiments, the EUV photoresist material is, e.g., polymethyl methacrylate (PMMA), the resist line 14 height or thickness is about 15 nm, the thickness of resist residual 16 (resist scumming) is about 5 nm or less, the thickness of hardmask 12 is about 5 nm, and the selected argon ion implantation energy is about 1500 eV (1.5 keV). In order to modify hardmask 12 with implanted argon ions throughout its thickness, it has to be substantially thinner than the resist lines 14 and comparable in thickness to the maximum thickness of resist residual 16. The argon ion dose is selected to substantially damage or alter hard mask 12 throughout its thickness such that its etching resistance is greatly reduced. This can be accomplished when the volume concentration of implanted argon atoms is from about 0.05 atomic percent to about 5 atomic percent throughout hardmask thickness or, equivalently, from about $2 \times 10^{19}$ atoms/cm$^3$ to about $2 \times 10^{21}$ atoms/cm$^3$. This volume concentration of argon atoms in implanted hardmask 12 including regions under resist residual 16 (resist scumming) can be achieved with the implanted argon ion dose of from about $2 \times 10^{13}$ ions/cm$^2$ to about $2 \times 10^{15}$ ions/cm$^2$.

Without providing any limitation, the resist residual 16 (resist scumming) is blocking less than half of the implanted ion dose in this example. In some example embodiments, the argon ion implantation can be conducted at below room temperature (23° C.) and, preferably, at or below minus 100° C. to enhance the modification of hardmask 12. Such a cold ion implantation process suppresses healing of broken or distorted chemical bonds in hardmask 12 and promotes a greater accumulation of implantation damage. A higher amount of accumulated implantation damage contributes to a greater etch rate increase of implanted hardmask 12. While the thickness of resist line 14 and related thickness of resist residual 16 (resist scumming), the thickness of hardmask 12, and the atomic number (Z) of selected etch enhancing element can vary, thus affecting the choice of the ion implantation energy and dose, the range of ion implantation energy of from about 1 keV to about 7 keV and ion implantation dose of from about $10^{13}$ ions/cm$^2$ to about $5 \times 10^{15}$ ions/cm$^2$ can be employed to selectively damage or otherwise modify the exposed hardmask 12, including regions under resist residual 16 (resist scumming). In some example embodiments, the implantation substrate temperature can be kept at below room temperature (23° C.) and, preferably, at or below minus 100° C.

FIG. 3 is a cross-sectional view of the semiconductor device of FIG. 2 where the implanted element penetrates into the hardmask, in accordance with an embodiment of the present invention.

In various example embodiments, the ion implantation 18 results in ions of a material being implanted into areas or regions 20 of the hardmask 12. The areas 20 can be referred to as doped or modified areas 20. The remaining hardmask areas can be designated as 12'. The remaining hardmask areas 12' are directly below or underneath the photoresist 14. The etch rate of the doped areas 20 is much different than the etch rate of the areas 12' based on specific plasma etch chemistries. This results is an advantageous pattern transfer. The resist residual 16, after implantation, can be designated as 17. Since the residual layer is very thin, usually smaller than about 6 nm, the hardmask underneath area 17 will also be doped.

FIG. 4 is a cross-sectional view of the semiconductor device of FIG. 3 where the photoresist is removed, in accordance with an embodiment of the present invention.

In various example embodiments, the photoresist 14 and doped residual layer 17 are stripped to expose the remaining hardmask regions 12' adjacent the doped regions 20. The structures in FIG. 4 is designated as structure 25.

There are two classes of photoresist stripping techniques, that is, wet stripping employing organic or inorganic solutions and dry (plasma) stripping. The most common wet strippers for positive photoresists are inorganic acid-based systems used at elevated temperatures. The most common dry strip chemistries are, e.g., $O_2/N_2$ and $CO/CO_2$ plasmas.

In some embodiments, where an etch-retarding implanted element is employed, the structure 25 shown in FIG. 4 can be subjected to an anneal compatible with OPL material 10. The purpose of this anneal is to increase an amount of strong chemical bonds between the implanted etch-retarding element and other elements present in the doped regions 20. Stronger chemical bonding reduces the etch rate of doped regions 20 resulting in a higher selectivity over regions 12'. This is opposite to the etch-enhancing implanted element where a high amount of weaker/damaged chemical bonds increases the etch rate of doped regions 20. For organic spin-on material 10, the anneal is limited to about 425° C. for conventional hot plate and rapid thermal anneals, to about 700° C. for millisecond-scale anneals, and to about 1000° C. for nanosecond-scale laser anneals. For spin-on carbon material 10, the anneal can be extended to a higher temperature of about 700° C. for conventional hot plate and rapid thermal anneals, to about 1000° C. for millisecond-scale anneals, and to about 1300° C. for nanosecond-scale laser anneals. The anneal thermal budget (temperature and duration) is selected to prevent excessive diffusion of the implanted element in hardmask 12. Millisecond- and nanosecond-scale anneals do not result in any substantial diffusion of dopants in hardmask 12 even at high temperature of 700° C.-1200° C. and therefore are preferred.

FIG. 5 is a cross-sectional view of the semiconductor device of FIG. 4 where either a positive tone etch or a negative tone etch is applied, in accordance with an embodiment of the present invention.

In various example embodiments, either a positive tone etch or a negative tone etch can be applied.

Hardmask 12' and implanted area 20 are now different with the additional implanted species in the region 20. This different composition of implanted area 20 allows the use of etch chemistry for removing either hardmask 12' or implanted area 20 with enough selectivity to each other. In one example, a $CF_4/CH_2F_2$ gas chemistry is employed to etch silicon oxide hardmask 12' selective to silicon implanted region 20. By analogy, with the resist developer tone, such combination of the hard mask material, etching chemistry, and the etch retarding implanted element will be referred to as a negative tone etch process resulting in a pattern inversion with respect to the original resist pattern. The resultant structure for a negative tone etch process is shown in FIG. 9. Conversely, a combination of the hard mask material, etching chemistry, and the etch enhancing implanted element will be referred to as a positive tone etch process resulting in a complete removal of the implanted area 20 selective to the hardmask material 12' preserving original resist pattern. In one example, the positive tone etch process uses hardmask 12' as a mask to dry etch away the argon implanted region 20 with a $CHF_3/C_4F_8$ or $C_4F_6$ and Ar gas chemistry. The resultant structure for a positive tone etch process is shown in FIG. 6.

FIG. 6 is a cross-sectional view of FIG. 5 where "positive tone etch" process is employed, in accordance with an embodiment of the present invention.

In various example embodiments, the OPL 10 is first patterned using remaining hardmask.

FIG. 7 is a cross-sectional view of FIG. 6 where the organic planarization layer (OPL) is etched, in accordance with an embodiment of the present invention utilizing positive tone etch process.

The etching of the OPL 10 can be performed using known techniques and dry etching chemistries suitable for the materials used to form the OPL 10 and selective to material 12'. Examples of OPL etching are $O_2/N_2$, $CO/CO_2$, $N_2/H_2$ or $O_2/SO_2$ based reactive ion etches. The etching process can be a timed etch to extend the openings 34 down to the hard mask layer or film 32 followed by a second etch to further extend the openings 34 down through the hard mask 32, as described in FIG. 8. A top surface 33 of the bottom hardmask 32 is also exposed.

After OPL openings 34 and OPL pattern features 35 are defined, the pattern is transferred to a bottom hardmask 32.

FIG. 8 is a cross-sectional view of FIG. 7 where the top hardmask is removed, or otherwise etched away during forming openings 34, and the bottom hardmask is etched, in accordance with an embodiment of the present invention.

In various example embodiments, the top hardmask 12' is removed, or otherwise etched away during forming openings 34, and the bottom hardmask 32 can be etched. The etching of the bottom hardmask 32 can be performed using known techniques and dry etching chemistries suitable for the materials used to form the bottom hardmask 32 and being selective to OPL features 35. The etching process can be a timed etch to extend the openings 36 within the bottom hardmask 32. In one exemplary embodiment, the bottom hard mask layer 32 can be made with an oxide material. Examples of etch chemistry are $CF_x$ based reactive ion etches to etch layer 32 and top mask 12'. The hard mask layer 32 can be formed of a tantalum oxide (TaO) layer or a titanium oxide (TiO) layer, a tetraethoxysilane (TEOS) layer, or a silicon layer such $SiO_2$, or other materials such as SiOF and SiON, for example. Hardmask film 32 can be formed using physical vapor deposition (PVD) or chemical vapor deposition (CVD) and has a thickness of less than about 100 nanometers and, usually, from about 20 nm to about 80 nm. Other thicknesses and methods of formation can be used alternatively, however, for hardmask film 32.

FIG. 9 is a cross-sectional view of FIG. 5 where "negative tone etch" process is employed, in accordance with an embodiment of the present invention.

In various example embodiments, the OPL 10 is first patterned using remaining hardmask 20.

FIG. 10 is a cross-sectional view of FIG. 9 where the organic planarization layer (OPL) is etched, in accordance with an embodiment of the present invention utilizing negative tone etch process.

The etching of the OPL 10 can be performed using known techniques and dry etching chemistries suitable for the materials used to form the OPL 10 and selective to material 20. Examples of OPL etching are $O_2/N_2$, $CO/CO_2$, $N_2/H_2$ or $O_2/SO_2$ based reactive ion etches. The etching process can be a timed etch to extend the openings 44 down to the hard mask layer or film 42 followed by a second etch to further extend the openings 44 down through the hard mask 42, as described in FIG. 11. A top surface 43 of the bottom hardmask 42 is also exposed.

After OPL openings 44 and OPL pattern features 45 are defined, the pattern is transferred to a bottom hardmask 32.

FIG. 11 is a cross-sectional view of FIG. 10 where the top hardmask is removed, or otherwise etched away during forming openings 44, and the bottom hardmask is etched, in accordance with an embodiment of the present invention.

In various example embodiments, the top hardmask 20 is removed, or otherwise etched away during forming openings 44, and the bottom hardmask 42 can be etched. The etching of the bottom hardmask 42 can be performed using known techniques and dry etching chemistries suitable for the materials used to form the bottom hardmask 42 and being selective to OPL features 45. The etching process can be a timed etch to extend the openings 46 within the bottom hardmask 42.

In one exemplary embodiment, the bottom hard mask layer 42 can be made with an oxide material. Examples of etch chemistry are $CF_x$ based reactive ion etches to etch layer 32 and top mask 20. The hard mask layer 42 can be formed of a tantalum oxide (TaO) layer or a titanium oxide (TiO) layer, a tetraethoxysilane (TEOS) layer, or a silicon layer such $SiO_2$, or other materials such as SiOF and SiON, for example. Hardmask film 42 can be formed using physical vapor deposition (PVD) or chemical vapor deposition (CVD) and has a thickness of less than about 100 nanometers and, usually, from about 20 nm to about 80 nm. Other thicknesses and methods of formation can be used alternatively, however, for hardmask film 42.

FIG. 12 illustrates graphs where silicon (Si) is implanted at 1 keV into a silicon oxide ($SiO_2$) hardmask and where a polymethyl methacrylate (PMMA) photoresist is employed, in accordance with an embodiment of the present invention.

In FIG. 12, Si is implanted at an implantation material energy of about 1 keV. The Si ions penetrate the $SiO_2$ hardmask 12 (FIGS. 2 and 3) at a predetermined depth. In graphs 50 and 52, the doping depth is about 6-7 nm in the hardmask 12 and in graphs 54 and 56, the doping depth is about 12-14 nm in the photoresist 14. To state it differently, 14 nm of PMMA photoresist is fully blocking Si ion implantation at 1 keV implantation energy.

Graph 52 illustrates the distribution of implanted ion/atom volume concentration versus implanted ion/atom depth, also known as the implanted ion depth ranges, in the $SiO_2$ hardmask 12, whereas graph 56 illustrates the distribution of implanted ion/atom volume concentration versus implanted ion/atom depth in the PMMA photoresist 14.

The implanted ion/atom volume concentration in units of atoms/cm$^3$ is normalized to the implanted ion/atoms dose in units of atoms/cm$^2$. The simulation data in graph 52 shows that the implanted silicon dose of from about $10^{14}$ ions/cm$^2$ to about $10^{16}$ ions/cm$^2$ yields the implanted silicon volume concentration near the peak or about 3-4 nm below the surface of $SiO_2$ hardmask 12 of from about $2.6 \times 10^{20}$ atoms/cm$^3$ to about $2.6 \times 10^{22}$ atoms/cm$^3$. The average volume concentration of implanted silicon within the top 6-7 nm of hardmask 12 is approximately 2 times lower than the obtained peak volume concentration. The simulation data in graph 56 shows that the peak volume concentration of the implanted silicon occurs at around 6-7 nm below the surface of PMMA photoresist 14 and that approximately half of implanted silicon dose is located deeper than the peak.

Accordingly, the resist residual 16 (resist scumming) of less than 5-7 nm in thickness can block less than half of the implanted silicon dose allowing more than half of the dose to be implanted into hardmask 12 underneath the resist residual 16 (resist scumming). This demonstrates that the selected ion implantation energy and dose range can be used to dope the hardmask 12 underneath the resist residual 16 (resist scumming) to a chemically significant level of from about $10^{20}$ atoms/cm$^3$ to about $10^{22}$ atoms/cm$^3$ or, equivalently, from about 0.2 atomic percent to about 20 atomic percent while fully blocking implanted silicon by 15-20 nm thick photoresist lines 14. Thus, the required etch selectivity of the hardmask 12' and the doped regions 20 can be achieved and the negative impact of the resist residual 16 (resist scumming) can be eliminated. The use of a highly directional etch such as a reactive ion etch is highly preferred because, in this case, a doped surface of hardmask 20 is sufficient (the rest of hardmask 20 may remain undoped) for providing required etch selectivity over an undoped hardmask 12'.

Graph 50 also illustrates a lateral spread of implanted silicon atoms in the hardmask 12. The lateral spread is about 2.8 nm. The lateral spread can lead to a lateral enlargement of doped areas 20 and a related size reduction of openings 44, 46 (FIGS. 10 and 11). This effect can be offset by printing resist lines/features 14 somewhat larger to make resist openings smaller leading to more narrow doped areas 20. In some embodiments, the lateral spread of the implanted silicon atoms can result in a beneficial effect of line edge roughness reduction due to a stochastic nature of lateral implant straggle that differs from various stochastic processes occurring during photoresist exposure to the EUV radiation. Nevertheless, in other embodiments, reducing effects of lateral dopant spreading is desirable because such processes can be easily adopted for existing EUV masks without any need for EUV mask correction or offset.

Figure 13:
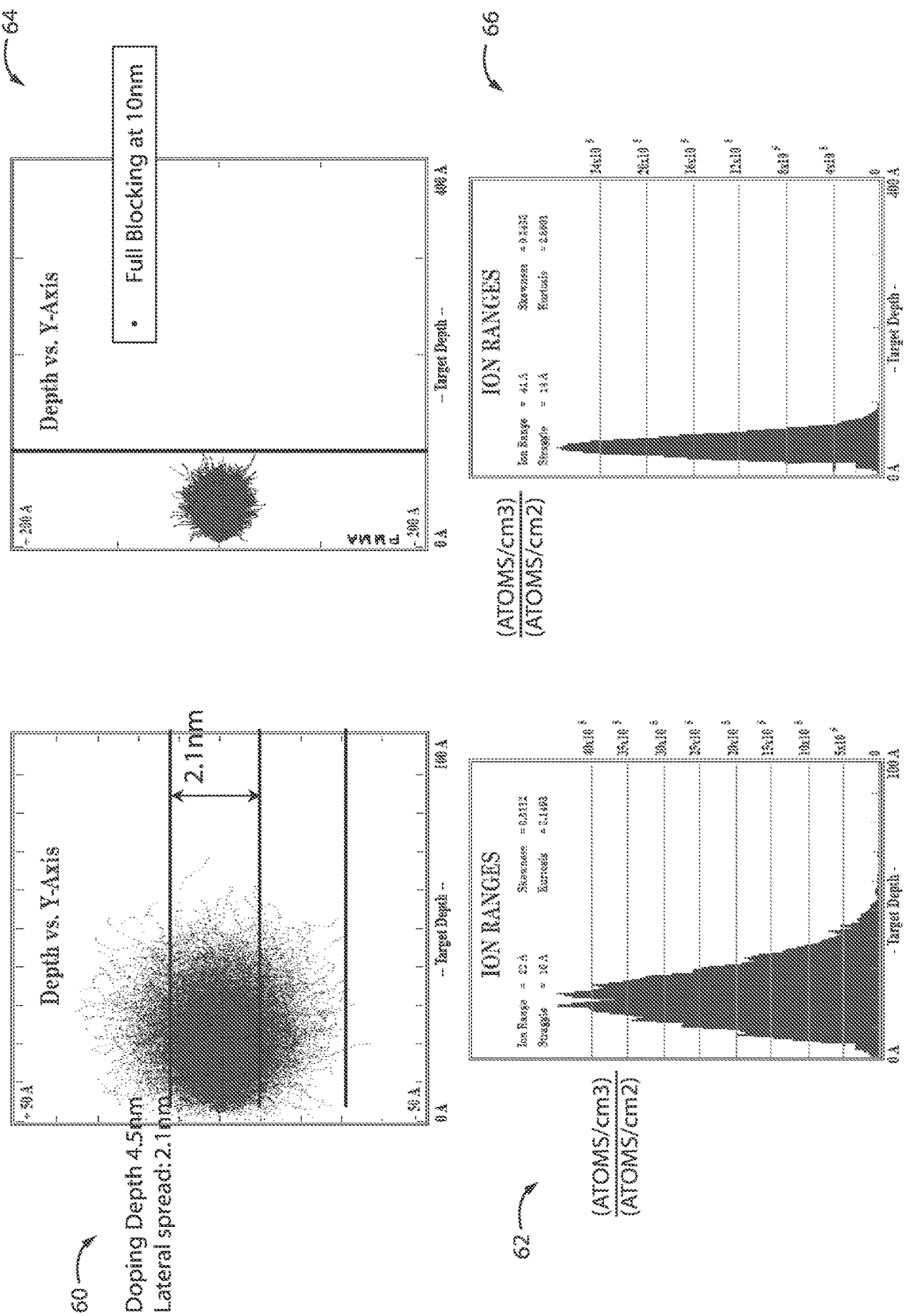
FIG. 13 illustrates graphs where silicon (Si) is implanted (500 eV) into a silicon oxide ($SiO_2$) hardmask and where a polymethyl methacrylate (PMMA) photoresist is employed, in accordance with an embodiment of the present invention.

FIG. 13 illustrates graphs where silicon (Si) is implanted at 500 eV into a silicon oxide ($SiO_2$) hardmask and where a polymethyl methacrylate (PMMA) photoresist is employed, in accordance with an embodiment of the present invention. This embodiment results in a tighter lateral control of implanted silicon atoms.

In FIG. 13, Si is implanted at an implantation energy of 500 eV. The Si ions penetrate the $SiO_2$ hardmask 12 (FIGS. 2 and 3) at a predetermined depth. In graphs 60 and 62, the doping depth is about 4-5 nm in the hardmask 12 and in graphs 64 and 66, the doping depth is about 8-9 nm in the photoresist 14. To state it differently, 10 nm of PMMA photoresist is fully blocking Si ions at 500 eV implantation energy.

Graph 62 illustrates the distribution of implanted ion/atom volume concentration versus implanted ion/atom depth in the $SiO_2$ hardmask 12, whereas graph 66 illustrates the distribution of implanted ion/atom volume concentration versus implanted ion/atom depth in the PMMA photoresist 14.

The simulation data in graph 62 shows that the implanted silicon dose of from about $1 \times 10^{14}$ ions/cm$^2$ to about $5 \times 10^{15}$ ions/cm$^2$ yields the implanted silicon volume concentration near the peak or about 2-3 nm below the surface of $SiO_2$ hardmask 12 of from about $4\times10^{20}$ atoms/cm$^3$ to about $2\times10^{22}$ atoms/cm$^3$. The average volume concentration of implanted silicon within the top 5 nm of hardmask 12 is approximately 2 times lower than the obtained peak volume concentration. The simulation data in graph 66 shows that the peak volume concentration of the implanted silicon occurs at around 4 nm below the surface of PMMA photoresist 14 and that approximately half of the implanted silicon dose is located deeper than its concentration peak.

Accordingly, the resist residual 16 (resist scumming) of less than 4-5 nm in thickness can block less than half of the implanted silicon dose allowing more than half of the dose to be implanted into hardmask 12 underneath the resist residual 16 (resist scumming). This demonstrates that the low ion implantation energy (less than about 1000 eV) and the selected implantation dose range can be used to dope the hardmask 12 underneath the resist residual 16 (resist scumming) to a chemically significant level of from about $1\times10^{20}$ atoms/cm$^3$ to about $1\times10^{22}$ atoms/cm$^3$ or, equivalently, from about 0.2 atomic percent to about 20 atomic percent while fully blocking implanted silicon atoms by thinner (10-15 nm) photoresist lines 14. Thus, the required etch selectivity of the hardmask 12' and the doped regions 20 can be achieved and the negative impact of the resist residual 16 (resist scumming) can be eliminated. Advantageously, the lateral spread of implanted Si atoms in hardmask 12 is reduced to about 2 nm at this low implantation energy of about 500 eV, as shown in graph 60.

When Argon (Ar) is implanted into a silicon oxide ($SiO_2$) hardmask and a polymethyl methacrylate (PMMA) photoresist, in accordance with an embodiment of the present invention, the distribution of implanted argon volume concentration will be similar to that of implanted silicon shown in FIGS. 12 and 13 due to a similar size or cross-section of Ar and Si atoms (similar atomic number Z).

Accordingly, similar conclusions can be drawn for the ranges of argon implantation energy and dose to enable the positive tone etch of implanted areas 20. However, the positive tone etch approach requires a complete removal of implanted hardmask material 20 selective to hardmask material 12. This can be accomplished only if the implanted material 20 is modified throughout its thickness (not just its surface). This requirement shifts the range of argon implantation energy toward higher energies.

Specifically, FIG. 12 shows that the exposed $SiO_2$ hardmask can be modified to a depth of less than 7-8 nm at about 1 keV implantation energy. This would limit the thickness of hardmask 12 to about 5 nm or below to account for the resist residual 16 (resist scumming). An ultra-thin hardmask 12 may not be sufficient for blocking etching of OPL 10 during a pattern transfer into OPL layer 10.

FIG. 13 shows that the exposed $SiO_2$ hardmask can be modified to a depth of less than about 5-6 nm at about 500 eV implantation energy. This may not be sufficient for modifying 5 nm-thick hardmask 12 underneath the resist residual 16 (resist scumming). Hence, the lower boundary of argon implantation energy is shifted to about 1 keV or above.

In one example, the Ar implantation energy is 1.5 keV modifying hardmask material 12 to a depth of about 9-10 nm, the resist line 14 height or thickness is about 15 nm, and the thickness of hardmask 12 is about 5 nm. The argon implantation dose range can be reduced with respect to that of silicon because the main mechanism of speeding up the etch rate of the implanted material 20 is the accumulation of implant damage in material 20 (number of distorted or broken chemical bonds). Each implanted ion can cause multiple broken or distorted chemical bonds and, hence, the dose of implanted argon can be from about $2\times10^{13}$ ions/cm$^2$ to about $2\times10^{15}$ ions/cm$^2$.

In conclusion, the exemplary embodiments of the present invention present a solution for elimination negative effects of resist scumming and more efficient EUV lithography pattern transfer.

In various embodiments, the etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It is to be understood that the present invention describes several independent techniques that can preserve or inverse original or designed patterns/shapes during EUV printing or pattern transfer. The relation of resultant pattern to the original or designed shapes will depend on a particular combinations of the mask tone, the resist/developer tone, the hardmask etch tone. For instance, the combination of bright field mask, negative tone develop, and negative tone hardmask etch will preserve the original or designed shape.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a structure and method for implantation post lithography to prevent or reduce resist scumming and resist line breaks (which are intended to be illustrative and not limiting), it is noted that modifications and variations can be made by persons skilled in the art in light of the above teachings. It is therefore to be understood that changes can be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for amplifying extreme ultraviolet (EUV) lithography pattern transfer into a hardmask and preventing hard mask micro bridging effects due to resist scumming in a semiconductor structure, the method comprising:

forming a top hardmask over an organic planarization layer (OPL);

depositing a photoresist over the top hardmask;

patterning the photoresist using EUV lithography;

performing ion implantation to create doped regions within the exposed top hardmask and regions of hardmask underneath resist scumming;

stripping the photoresist; and selectively etching the top hardmask by either employing positive tone or negative tone etch based on an implantation material, wherein an ion implantation energy is selected to be high enough for ions to penetrate through the resist scumming and into the top hardmask but low enough for the ions to be stopped in the photoresist.

2. The method of claim 1, wherein EUV exposure is conducted before the etching step.

3. The method of claim 1, wherein the ion implantation occurs below room temperature for the positive tone hardmask etch to suppress healing of broken or distorted chemical bonds in the top hardmask and to enable a greater accumulation of implantation damage.

4. The method of claim 1, wherein lateral dopant spreading is offset without a need for EUV mask correction.

5. The method of claim 1, wherein an anneal is employed after the stripping of the photoresist for the negative tone hardmask etch.

6. The method of claim 5, wherein an anneal thermal budget is selected to prevent excessive diffusion of the implantation material in the top hardmask for the negative tone hardmask etch.

7. The method of claim 1, wherein, when the positive tone hardmask etch is employed, the OPL is patterned using remaining hardmask portions.

8. The method of claim 7, wherein the OPL is etched to create openings extending to a bottom hardmask film.

9. The method of claim 8, wherein after the openings are defined, the EUV lithography pattern is transferred to a bottom hardmask.

10. A method for amplifying extreme ultraviolet (EUV) lithography pattern transfer into a hardmask and preventing hard mask micro bridging effects due to resist scumming in a semiconductor structure, the method comprising:
implanting an implantation material into a top hardmask and through a photoresist;
creating a plurality of modified regions within the exposed top hardmask and regions of hardmask underneath resist scumming;
stripping the photoresist; and
selectively etching the top hardmask by either employing positive tone or negative tone based on the implantation material,
wherein an ion implantation energy is selected to be high enough for ions to penetrate through the resist scumming and into the top hardmask but low enough for the ions to be stopped in the photoresist.

11. The method of claim 10, wherein the top hardmask is formed over an organic planarization layer (OPL).

12. The method of claim 11, wherein, when the positive tone is employed, the OPL is patterned using remaining hardmask portions.

13. The method of claim 12, wherein an etch is conducted to extend openings through a bottom hardmask film and wherein after the openings and pattern features are defined, the EUV lithography pattern is transferred to the bottom hardmask film.

14. The method of claim 10, wherein the implantation material includes at least one of silicon (Si) or argon (Ar).

15. The method of claim 10, wherein EUV exposure is conducted before the etching step.

16. The method of claim 10, wherein the implanting occurs below room temperature for the positive tone hardmask etch to suppress healing of broken or distorted chemical bonds in the top hardmask and to enable a greater accumulation of implantation damage.

17. The method of claim 10, wherein lateral dopant spreading is offset without a need for EUV mask correction.

18. The method of claim 10, wherein an anneal is employed after the stripping of the photoresist for the negative tone hardmask etch and wherein an anneal thermal budget is selected to prevent excessive diffusion of the implantation material in the top hardmask for the negative tone hardmask etch.

* * * * *